United States Patent
Gueissaz et al.

(10) Patent No.: US 11,573,535 B2
(45) Date of Patent: *Feb. 7, 2023

(54) USER-TESTABLE THERMOELECTRIC WATCH

(71) Applicant: The Swatch Group Research and Development Ltd, Marin (CH)

(72) Inventors: Francois Gueissaz, Cormondreche (CH); Alain Jornod, Neuchatel (CH); Yves Theoduloz, Yverdon-les-Bains (CH)

(73) Assignee: The Swatch Group Research and Development Ltd, Marin (CH)

( * ) Notice: Subject to any disclaimer, the term of this patent is extended or adjusted under 35 U.S.C. 154(b) by 320 days.

This patent is subject to a terminal disclaimer.

(21) Appl. No.: 16/430,782

(22) Filed: Jun. 4, 2019

(65) Prior Publication Data
US 2020/0004204 A1    Jan. 2, 2020

(30) Foreign Application Priority Data

Jul. 2, 2018   (EP) .................................... 18181272

(51) Int. Cl.
*G04C 10/00*      (2006.01)
*H01L 35/30*      (2006.01)

(52) U.S. Cl.
CPC .............. *G04C 10/00* (2013.01); *H01L 35/30* (2013.01)

(58) Field of Classification Search
CPC ......... H01L 35/02; H01L 35/32; H01L 35/30; G04C 10/00
See application file for complete search history.

(56) References Cited

U.S. PATENT DOCUMENTS 4,586,001 A * 4/1986 Pye ..................... H03F 3/3066
                                                              330/146
6,327,127 B1   12/2001 Utsunomiya et al.
(Continued)

FOREIGN PATENT DOCUMENTS

CN         1305129 A      7/2001
CN         1629754 A      6/2005
(Continued)

OTHER PUBLICATIONS

Analog Technologies, "The minimum limited voltage of 5 common colors LED lights", Dec. 24, 2014, pp. 1-3; www.analogtechnologies.com/white-paper/2014/1224/122.htm (Year: 2014).*

(Continued)

*Primary Examiner* — Tamir Ayad
(74) *Attorney, Agent, or Firm* — Oblon, McClelland, Maier & Neustadt, L.L.P.

(57) ABSTRACT

A thermoelectric watch includes a thermoelectric generator; a voltage booster connected to the thermoelectric generator, and an energy management circuit connected to the voltage booster and configured to control the charging of at least one energy storage element. The energy management circuit includes an output configured to change from a first logic state to a second logic state when the thermoelectric generator starts generating electrical energy, and to change from the second logic state to the first logic state when the thermoelectric generator finishes generating electrical energy.

7 Claims, 3 Drawing Sheets

(56) References Cited

U.S. PATENT DOCUMENTS

| | | | | |
|---|---|---|---|---|
| 2005/0116687 | A1* | 6/2005 | Yokomizo | H02J 7/0068 |
| | | | | 320/128 |
| 2013/0076245 | A1* | 3/2013 | Phadke | H05B 45/50 |
| | | | | 315/121 |
| 2014/0375246 | A1* | 12/2014 | Boysen, III | H02J 7/342 |
| | | | | 320/101 |
| 2015/0286247 | A1* | 10/2015 | Zorkendorfer | G06F 1/1632 |
| | | | | 361/679.03 |
| 2016/0085022 | A1* | 3/2016 | Yang | G02B 6/0096 |
| | | | | 362/23.08 |
| 2018/0173169 | A1 | 6/2018 | Gueissaz et al. | |
| 2018/0288843 | A1* | 10/2018 | Sakai | H05B 45/40 |

FOREIGN PATENT DOCUMENTS

| | | |
|---|---|---|
| CN | 107065508 A | 8/2017 |
| CN | 107807513 A | 3/2018 |
| EP | 0 933 863 A2 | 8/1999 |
| EP | 0 935 178 A2 | 8/1999 |
| EP | 0 935 334 A2 | 8/1999 |
| EP | 3 339 981 A1 | 6/2018 |
| JP | 11-133165 A | 5/1999 |
| JP | 2018-100981 A | 6/2018 |
| WO | WO-2017057401 A1 * 4/2017 | H05B 45/37 |

OTHER PUBLICATIONS

European Search Report dated Jan. 22, 2019 in European Application 18181272.8 filed on Jul. 2, 2018 (with English translation of Categories of Cited Documents).

Combined Chinese Office Action and Search Report dated Nov. 11, 2020 in Patent Application No. 201910585149.3 (with English translation and English translation of Category of Cited Documents), citing documents AO-AU therein, 8 pages.

* cited by examiner

USER-TESTABLE THERMOELECTRIC WATCH

FIELD OF THE INVENTION

The invention relates to a thermoelectric watch including a thermoelectric generator, a voltage booster connected to said thermoelectric generator and an energy management circuit connected to said voltage booster and configured to control the charging of at least one energy storage element.

BACKGROUND OF THE INVENTION

In the field of thermoelectric watches, those skilled in the art know that a thermoelectric generator can be used to provide electrical energy to a watch from body heat when the watch is on the wrist. As the thermoelectric generator produces a low voltage, a voltage booster can increase the voltage produced so as to obtain a sufficiently high voltage to power an energy management circuit. The energy management circuit makes it possible to charge at least one storage element such as a battery in order to power a motor of the thermoelectric watch even when the conditions for thermoelectric energy generation are no longer satisfied. The intensity of thermoelectric generation can be displayed by means of a circular bar graph at the edge of the thermoelectric watch dial. A user can thus see whether thermoelectric generation is active.

One drawback is that the bar graph uses an LCD display which is controlled by an output of the energy management circuit. The LCD display operates continuously and uses a few microwatts, at best, and up to several hundred microwatts. Given that the thermoelectric power generated by a device worn on the wrist can barely exceed several microwatts at rest, such an LCD device appears to be highly detrimental to the energy budget.

SUMMARY OF THE INVENTION

It is an object of the present invention to overcome the aforementioned drawback.

To this end, the invention relates to a thermoelectric watch.

Thus, as will be seen in detail hereinafter, when the energy management output changes from one state to another (via a rising or falling transition), the light emitting diode emits a light pulse (flash of light). This lets the user know when thermoelectric generation is enabled or disabled.

BRIEF DESCRIPTION OF THE DRAWINGS

The invention will be described in more detail below with reference to the annexed drawings, given by way of non-limiting example, and in which.

DETAILED DESCRIPTION OF THE INVENTION

Elements that are identical in structure or function appearing in the various Figures maintain the same references, unless otherwise specified.

Thermoelectric watch 1 according to the invention is described with reference to FIGS. 1 to 3.

Figure 1:
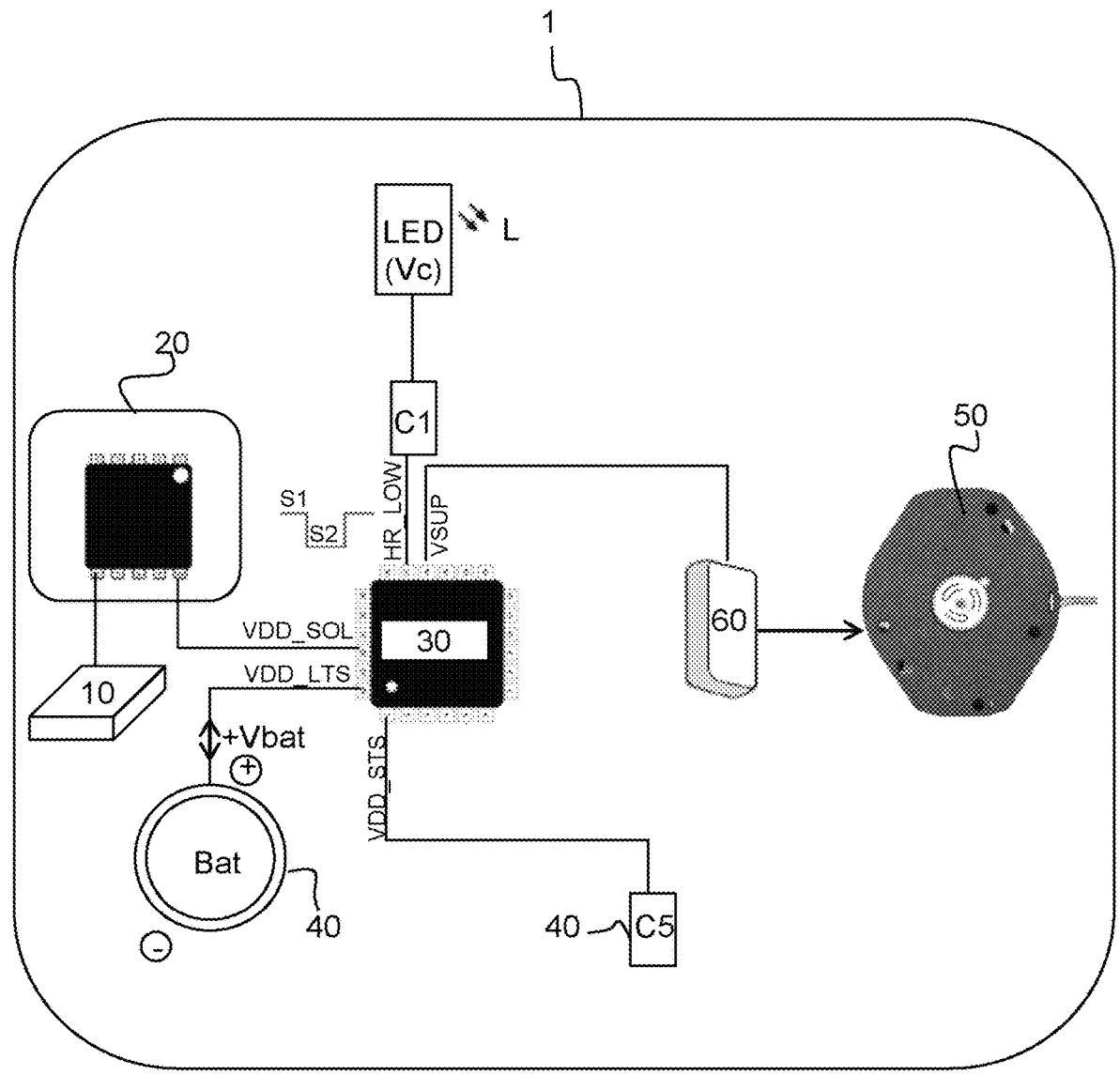
FIG. 1 schematically represents a thermoelectric watch according to the invention, said thermoelectric watch including a voltage generator, a voltage booster and an energy management circuit.

As illustrated in FIG. 1, thermoelectric watch 1 includes:
a thermoelectric generator 10;
a voltage booster 20;
an energy management circuit 30;
at least one capacitor C1 coupled to a light emitting diode LED;
said light emitting diode LED.

Thermoelectric watch 1 also includes:
an energy storage element 40;
a motor 50 configured to move the hands and dial(s) (not illustrated) of thermoelectric watch 1;
a resonator 60 configured to act as frequency base for thermoelectric watch 1.

In the following description, thermoelectric watch 1 is also referred to as watch 1. The elements of watch 1 are described in detail hereinafter.

Thermoelectric Generator 10

Thermoelectric generator 10 is configured to produce electrical energy, namely a low voltage, on the order of a few millivolts (mV) from human body heat when watch 1 is on a user's wrist. In a non-limiting example, the voltage is comprised between 6 and 12 mV. It will be noted that generation of electrical energy normally takes less than one second when watch 1 is placed on the wrist.

Thus, thermoelectric generator 10 becomes active when the watch is worn on the wrist. Thermoelectric generator 10 allows watch 1 to be started when the battery of said watch is discharged.

Since thermoelectric generators are known to those skilled in the art, thermoelectric generator 10 is not described in detail here.

Thermoelectric generator 10 is connected to voltage booster 20.

Voltage Booster 20

Voltage booster 20 is configured to boost the voltage generated by thermoelectric generator 10 to obtain a sufficiently high voltage to power energy management circuit 30. This voltage is on the order of a volt. In a non-limiting example, it is equal to 2.5V.

Voltage booster 20 is connected to energy management circuit 30.

The voltage generated is on an input VDD_SOL of said energy management circuit 30. Thus, a voltage higher than or equal to a threshold (2.5 V in the non-limiting example described) means that thermoelectric generator 10 is enabled, in other words that it has started generating electrical energy.

Since voltage boosters are known to those skilled in the art, voltage booster 20 is not described in detail here.

Energy Control Circuit 30 and Energy Storage Element 40

Energy control circuit 30 is configured to control the charging of at least one energy storage element 40.

In a non-limiting embodiment, energy management circuit 30 is a programmable microcontroller configured to charge said at least one energy storage element 40.

In a non-limiting embodiment management circuit 30 includes a push-pull amplifier circuit in order to obtain rising and falling transitions across output HR_LOW described below, with a certain capacity to deliver current, typically 1 to 2 mA in a non-limiting embodiment.

As illustrated in FIG. 1, energy management circuit 30 includes, in particular:
- an input VDD_SOL,
- an output HR_LOW,
- an output VSUP,
- an output VDD_LTS,
- an output VDD_STS.

Through the voltage received at its input VDD_SOL, energy management circuit 30 can power said at least one energy storage element 40.

In a non-limiting example, said at least one energy storage element 40 is a battery Bat. Battery Bat makes it possible to power, for example, motor 50 of watch 1, even when there is no longer any electrical energy generation.

In a non-limiting embodiment, energy management circuit 30 is configured to control the charging of two energy storage elements 40. Each energy storage element 40 is connected to energy management circuit 30 via the respective outputs VDD_LTS and VCC_STS.

In a non-limiting embodiment, a first energy storage element 40 is a short term storage element and a second energy storage element 40 is a long term storage energy element. In a non-limiting example, the short term energy storage element is a capacitor referenced C5 in FIG. 1, and the long term energy storage element is a rechargeable battery referenced Bat in FIG. 1. In a non-limiting example, battery Bat is a lithium-ion battery.

Capacitor C5 and battery Bat are used as non-limiting examples in the following description.

In a non-limiting embodiment, said energy management circuit 30 is configured to alternately control the charging of capacitor C5 and of battery Bat in order to power, for example, motor 50 of said watch 1. To this end, it also includes a plurality of switches (not illustrated).

Thus, via its input VDD-SOL, energy management circuit 30 starts by charging capacitor C5, which is charged in a few seconds (typically between 3 to 5 seconds depending on the desired end experience). Then, when capacitor C5 is charged (it has reached a sufficient voltage, between 1.5V and 3 V, for example), energy management circuit 30 disconnects capacitor C5 from its input VDD_SOL and, via its input VDD-SOL, charges battery Bat, which charges more slowly over a few hours or even a few days, until it reaches a sufficient voltage, between 1.5 V and 3 V, for example.

While battery Bat is charging, capacitor C5 is discharging at output VSUP, which makes it possible to power motor 50 of watch 1 and thus to start the movement of watch 1. Capacitor C5 actually discharges in a few seconds.

Battery Bat takes over from capacitor C5 to power motor 50. Battery Bat also discharges across output VSUP, which makes it possible to power motor 50 of watch 1 for several months. Battery Bat can in fact take several months to discharge.

When capacitor C5 and battery Bat have each reached a sufficient voltage, energy management circuit 30 connects the two in parallel.

Thus, when thermoelectric generator 10 is active, the electrical energy generated by thermoelectric generator 10 arrives at input VDD_SOL, which makes it possible to charge capacitor C5 and battery Bat.

When thermoelectric generator 10 is inactive, i.e. it is no longer generating electrical energy, capacitor C5 and battery Bat are disconnected from input VDD_SOL.

Thermoelectric generator 10 becomes inactive when, for example, watch 1 is in thermal equilibrium and is no longer worn on the wrist. When it is placed on the wrist again, the alternating control of the charging of capacitor C1 and battery Bat described above starts again.

Output HR_LOW of energy management circuit 30 is configured to:
- change from a first logic state S1 to a second logic state S2 when said thermoelectric generator 10 starts generating electrical energy, and
- change from second logic state S2 to first logic state S1 when said thermoelectric generator 10 finishes generating electrical energy.

Output HR_LOW thus indicates activity of thermoelectric generator 10.

Hereinafter, it is assumed that first logic state S1 is a high state and second logic state S2 is a low state. However, the reverse is also possible.

In a non-limiting embodiment, high state S1 is at potential +Vbat and low state S2 is at potential −Vbat.

Thus, output HR_LOW is in rising transition when it changes from low state S2 to high state S1 and falling transition when it changes from high state S1 to low state S2.

More particularly, output HR_LOW is configured to:
- change from high state S1 to low state S2 when said thermoelectric generator 10 starts generating electrical energy, and
- change from low state S2 to high state S1 when said thermoelectric generator 10 finishes generating electrical energy.

The low state of output HR_LOW means that thermoelectric generator 10 is active. The high state of output HR_LOW means that thermoelectric generator 10 is inactive.

It is considered that, during normal use, output HR_LOW cannot have more than a hundred rising and/or falling transitions per day. A hundred transitions per day corresponds to a mean current of less than 0.1 microamps through the coupling element C1 mentioned below, which represents a low percentage of the power consumption of watch 1, less than 10%.

Energy management circuit 30 is connected to said at least one capacitor C1 described below.

Capacitor C1 and Light Emitting, Diode LED

Figure 2A:
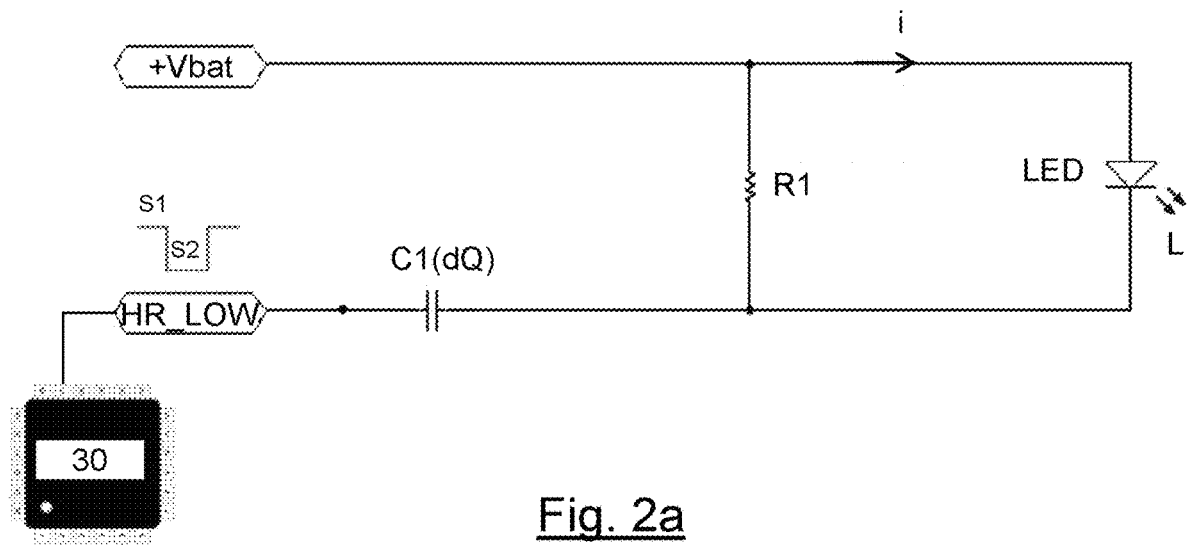
FIG. 2a represents the energy management circuit of FIG. 1 connected to a capacitor, itself coupled to a light emitting diode, according to a first non-limiting variant of a first embodiment of the invention.
Figure 2B:
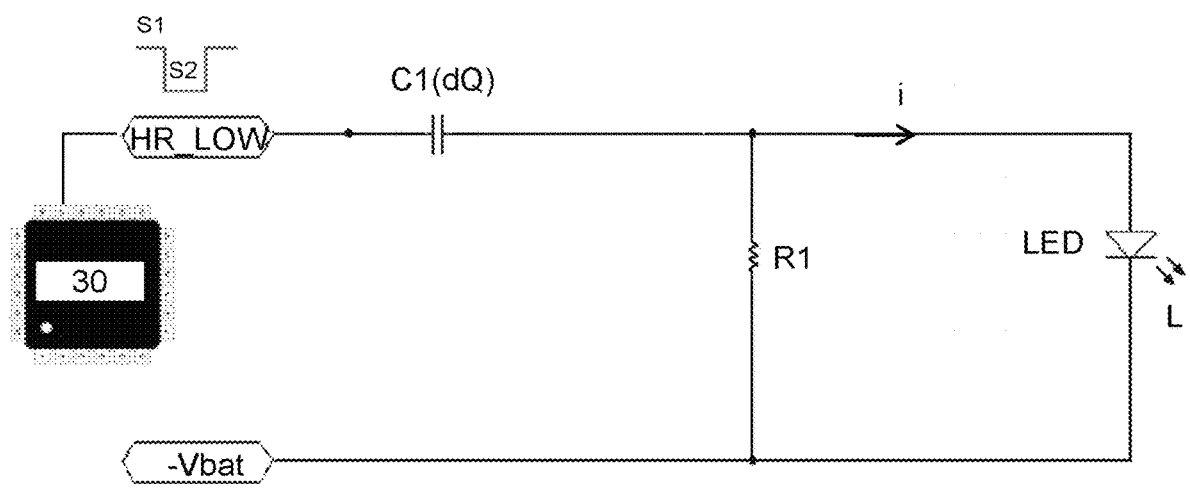
FIG. 2b represents the energy management circuit of FIG. 1 connected to a capacitor, itself coupled to a light emitting diode, according to a second non-limiting variant of the first embodiment of the invention.

As illustrated in FIGS. 1, 2a and 2b, said at least one capacitor C1 is coupled to a light emitting diode LED and is configured to:
- undergo a variation of charge dQ when said output HR_LOW of said energy management circuit 30 changes from a state S1, S2 to another state S2, S1.
- supply current to said light emitting diode LED when it undergoes said variation of charge dQ.

The current that powers light emitting diode LED is equal to dQ/dt. As the charge of a capacitor is expressed as Q=C*U, the maximum, in the non-limiting example, is Q1=C1*Vbat, and dQ=+ or −Q1

Capacitor 1 is connected in series with said light emitting diode LED.

When capacitor C1 undergoes a variation of charge dQ, the charging or discharging current i, otherwise referred to as current i, required for the charging or discharging thereof, temporarily flows into light emitting diode LED allowing it to emit a light pulse L in the visible spectrum, otherwise referred to as visible light pulse L or light pulse L.

It will be noted that after a rising or falling transition of output HR_LOW, when said output HR_LOW remains in one of the two states S1, S2, there is no current i flowing in light emitting diode LED. Thus, light emitting diode LED does not use energy in steady state but only during rising and falling transitions. Its mean potential is Uq=0.

Current i which flows through light emitting diode LED is actually a current burst since it is only produced when capacitor C1 undergoes a variation of charge dQ, i.e. during rising and falling transitions of output HR_LOW. The intensity of this current burst is on the order of a milliamp. In a non-limiting example, it is comprised between 1 and 10 mA. It will be noted that the intensity of current bursts typically falls to 10% after a duration of at least 50 milliseconds. Thus, the light pulse L emitted by light emitting diode LED is seen for a duration of typically less than 50 milliseconds.

In a non-limiting embodiment, said at least one capacitor C1 is connected to a resistor R1. Resistor R1 is connected in parallel with said at least one light emitting diode LED.

Resistor R1 makes it possible for said capacitor C1 to be discharged slowly and gradually after each rising or falling transition of output HR_LOW, i.e. when the corresponding light emitting diode LED is no longer conducting. It will be noted that, in a non-limiting example, resistor R1 causes capacitor C1 to discharge by 90 to 99% in 5 and 10 seconds between each transition. The time constants RC are thus typically between 5 and 10 seconds. Capacitor C1 discharges to obtain zero potential difference at its terminals.

Light emitting diode LED is configured to emit a visible light pulse L when charging or discharging current i from said capacitor C1 passes therethrough. In the following description, visible light pulse L is also referred to as light pulse L.

In a non-limiting embodiment, light emitting diode LED is disposed behind an aperture in a dial of watch 1 so that light pulse L is visible to the user of watch 1.

In a first non-limiting embodiment illustrated in FIG. 2a, said at least one capacitor C1 is coupled to a green light emitting diode LED, and is configured to charge when said output HR_LOW of said energy management circuit 30 changes from high state S1 to low state S2, i.e. when said output HR_LOW is in falling transition.

This corresponds to the start of electrical energy generation by thermoelectric generator 10. The current i required to charge capacitor C1 passes through green light emitting diode LED which then emits a green light pulse L.

The change of state of output HR_LOW thus causes emission of a light pulse L by light emitting diode LED.

Thus, when thermoelectric generator 10 starts generating energy (becomes active), green light emitting diode LED emits a green light pulse L which is visible to the user of watch 1. The user thus knows that thermoelectric generator 10 is operating, i.e. that thermoelectric generator 10 is starting to generate electrical energy.

In a non-limiting example, thermoelectric generator 10 becomes active when watch 1 is placed on the user's wrist. Indeed, watch 1 receives human body heat.

After the falling transition, when output HR_LOW remains in low state S2 (thermoelectric generator 10 is still active), the value of current i flowing in green light emitting diode LED quickly drops to zero. Consequently, the user no longer sees a flash of green light.

When output HR_LOW changes from low state S2 to high state S1 (thermoelectric generator 10 becomes inactive), there is no current i flowing in green light emitting diode LED. Capacitor C1, which is connected to a resistor R1, discharges to obtain zero potential difference at its terminals.

It will be noted that the anode of green light emitting diode LED is connected to the positive battery terminal +Vbat. However, in another non-limited embodiment that is not illustrated, the anode of green light emitting diode LED could also be connected to the negative terminal −Vbat of battery Bat or any other static potential. This makes it possible, in every instance, to have a potential difference at the terminals of green light emitting diode LED when there is a change to low state S2, which is at potential −Vbat in the non-limiting example used, so that a current can flow in green light emitting diode LED.

In a second non-limiting embodiment illustrated in FIG. 2b, said at least one capacitor C1 is coupled to a red light emitting diode LED, and is configured to discharge when said output HR_LOW of said energy management circuit 30 changes from low state S2 to high state S1, i.e. when said output HR_LOW is in rising transition.

This corresponds to the end of electrical energy generation by thermoelectric generator 10. The current i required to discharge capacitor C1 passes through red light emitting diode LED which then emits a red light pulse L.

The change of state of output HR_LOW causes emission of a light pulse L from light emitting diode LED.

Thus, when thermoelectric generator 10 finishes generating energy (becomes inactive), red light emitting diode LED emits a red light pulse L which is visible to the user of watch 1. The user thus knows that thermoelectric generator 10 is shutting down, i.e. it is finishing electrical energy generation.

In a non-limiting example, thermoelectric generator 10 becomes inactive when watch 1 is no longer worn on the user's wrist. Indeed, watch 1 is no longer in contact with human body heat and thus tends towards thermal equilibrium at the thermoelectric generator terminals.

In another non-limiting example, thermoelectric generator 10 becomes inactive when watch 1 is in full sun with a dark dial that absorbs energy from the sun. Even if it remains on the wrist, the case middle of watch 1 becomes warmer than the wrist. Thermoelectric generator 10 can stop several times during the day. It is considered that, during normal use, thermoelectric generator 10 can stop and become active again at most one hundred times per day.

After the rising transition, when output HR_LOW remains in high state S1 (thermoelectric generator 10 is still inactive), the value of current i flowing in red light emitting diode LED quickly drops to zero. Consequently, the user no longer sees a flash of red light.

When output HR_LOW changes from high state S1 to low state S2 (thermoelectric generator 10 becomes active), there is no current i flowing in red light emitting diode LED. Capacitor C1, which is connected to a resistor R1, discharges to obtain zero potential difference at its terminals.

It will be noted that the cathode of red light emitting diode LED is connected to the negative battery terminal −Vbat. However, in another non-limited embodiment that is not illustrated, the cathode of red light emitting diode LED could also be connected to the positive terminal +Vbat of battery Bat or any other static potential. This makes it possible, in every instance, to have a potential difference at the terminals of red light emitting diode LED when there is a change to high state S1, which is at potential +Vbat in the non-limiting example used, so that a current can flow in red light emitting diode LED.

Figure 3:
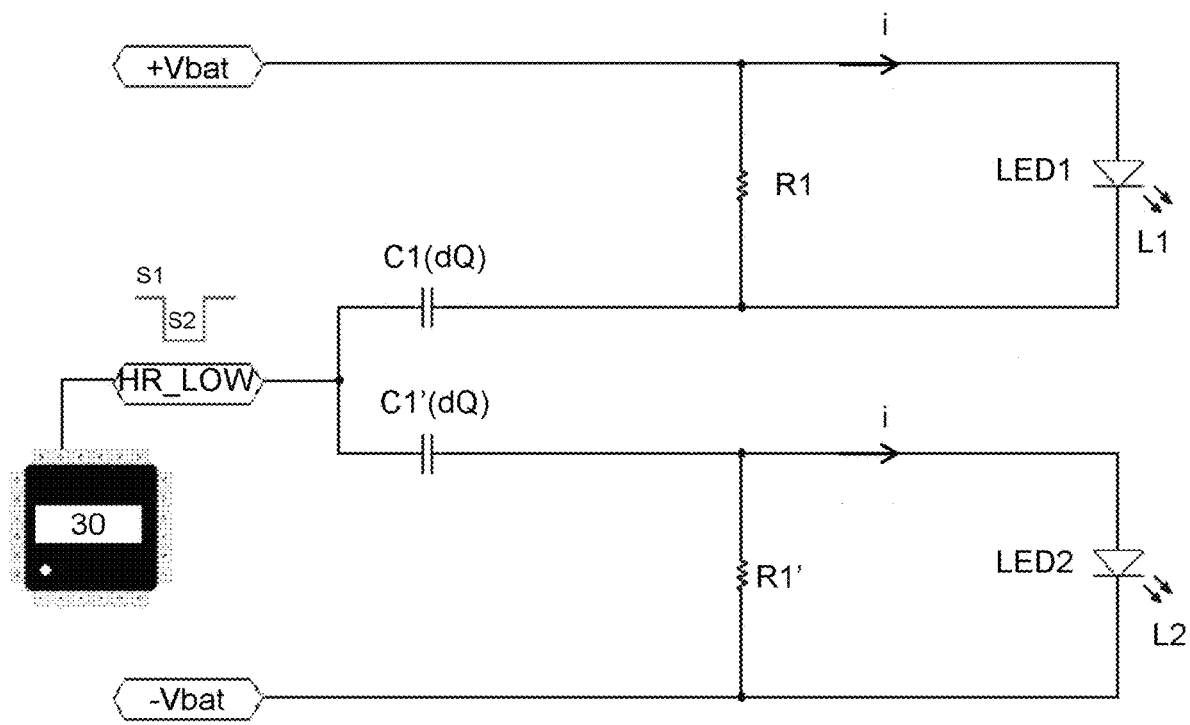
FIG. 3 represents the energy management circuit of FIG. 1 connected to two capacitors, each coupled to a light emitting diode, according to a second non-limiting embodiment.

In a third non-limiting embodiment illustrated in FIG. 3, said energy management circuit 30 is connected to two capacitors C1, C1', each coupled to a light emitting diode LED1, LED2.

In a non-limiting embodiment, one light emitting diode LED1 is green, and the other light emitting diode LED2 is red.

In a non-limiting embodiment, one of the capacitors is configured to undergo a variation of charge dQ when said output HR_LOW changes from high state S1 to low state S2 and the other capacitor is configured to undergo a variation of charge dQ when said output HR_LOW changes from low state S2 to high state S1.

In a non-limiting embodiment, one of the capacitors is configured to charge when said output HR_LOW changes from high state S1 to low state S2 and the other capacitor is configured to discharge when said output HR_LOW changes from low state S2 to high state S1.

Thus, according to this non-limiting variant, capacitor C1 is configured to charge when said output HR_LOW changes from high state S1 to low state S2, and capacitor C1' is configured to discharge when said output HR_LOW changes from low state S2 to high state S1.

Thus, the current i required to charge capacitor C1 flows in green light emitting diode LED1, and the current i required to discharge capacitor C1' flows in red light emitting diode LED2.

Green light emitting diode LED1 emits a green light pulse L1 when thermoelectric generator 10 starts generating electrical energy, and red light emitting diode LED2 emits a red light pulse L2 when thermoelectric generator 10 finishes generating electrical energy.

In this manner, the user of watch 1 can see via flashes of green light L1 or red light L2 respectively, the beginning and end of electrical energy generation by thermoelectric generator 10.

It will be noted that a green light pulse L1, visible to the user, appears a few seconds after watch 1 has been placed on the wrist, once short term energy storage element C5 is charged with the electrical energy produced by thermoelectric generator 10.

It will be noted that a red light pulse L2, visible to the user, appears a few seconds to a few minutes, depending on temperature conditions, after watch 1 has been removed from the wrist. This duration corresponds to the time taken by the back cover of watch 1, which was heated by human body heat, to cool down.

It will be noted that the light intensity of light pulse L from a light emitting diode depends on the way in which the corresponding capacitor C1 charges or discharges. The physiological perception of this light pulse L depends essentially on its temporal integral, proportional to the charging or discharging speed of the corresponding capacitor C1. As the voltage at the terminals of capacitor C1 is fixed (equal to +or −Vbat), the value of capacitor C1 is adjusted to obtain a determined intensity of light pulse L.

It will be noted that the conduction voltage of a green light emitting diode is generally higher than that of a red light emitting diode and its efficiency is lower than that of a red light emitting diode.

Thus, depending on the type of light emitting diode, the value of the corresponding capacitor C1 is adjusted. To obtain the same physiological perception of light pulse L for both the green and red light emitting diodes, typically the value of the capacitor C1 corresponding to green light emitting diode LED1 is increased relative to that of the capacitor C1 corresponding to red light emitting diode LED2. In the non-limiting example, the value of the capacitor C1 corresponding to green light emitting diode LED1 is equal to 22 µF and the value of the capacitor C1 corresponding to red light emitting diode LED2 is equal to 10 µF. Thus, for a value of 22 µF, a total charge of 55 µC (Coulomb) is obtained for a battery voltage Vbat equal to 2.5 V. For a value of 10 µF, a total charge of 25 µC (Coulomb) is obtained for a battery voltage Vbat equal to 2.5 V. Thus, a falling or rising transition uses a very low charge which corresponds to a charging/discharging current i of a few milliamps. Consequently, a low charging/discharging current i is used to emit a green or red light pulse visible in broad daylight. Very little current is used to alert the user to thermoelectric generation or non-generation.

In a non-limiting embodiment, a light emitting diode LED has a conduction voltage Vc comprised between 1.5 V and 3 V. Consequently, to make light pulses L possible, battery voltage Vbat must be higher than conduction voltage Vc. In a non-limiting embodiment, battery voltage Vbat is thus higher than 1.5 V. In a non-limiting variant, battery voltage Vbat is comprised between 2 V and 4 V. This range of values corresponds to lithium-ion batteries commonly found on the market. This range of values is sufficient for a current to flow in a light emitting diode LED so that the latter emits a light pulse L visible in broad daylight. Thus, light emitting diode LED makes it possible to convert electrical energy into a light pulse that is widely visible in broad daylight.

Of course, this invention is not limited to the illustrated example but is capable of different variants and modifications that will appear to those skilled in the art.

Therefore, in another non-limiting embodiment, a light emitting diode LED emits a colour other than red or green.

The invention claimed is:

1. A thermoelectric watch comprising:
a thermoelectric generator,
a voltage booster connected to said thermoelectric generator;
an energy management circuit connected to said voltage booster and configured to control the charging of at least one energy storage element, said energy management circuit including an output configured to change from a first logic state to a second logic state when said thermoelectric generator starts generating electrical energy, and to change from the second logic state to the first logic state when said thermoelectric generator finishes generating electrical energy,
wherein the watch further includes a first capacitor, the first capacitor being in addition to the at least one energy storage element, and the first capacitor is connected to said energy management circuit, coupled to a first light emitting diode, and said energy management circuit is programmed to cause the first capacitor to:
undergo a variation of charge to send a current burst to the first light emitting diode in response to said output of said energy management circuit changing from the first logic state to the second logic state and in response to said output of said energy management circuit changing from the second logic state to the first logic state,
supply current to said first light emitting diode in response to said first capacitor undergoing said variation of charge, said first light emitting diode being configured to emit a light pulse in the visible spectrum when said current flows therethrough, and
end the supply of the current to said first light emitting diode upon completion of the variation of charge when the energy management circuit is in the first logic state and when the energy management circuit is in the second logic state such that the energy management circuit does not instruct the first capacitor to send the current burst to the first light emitting diode when the energy management circuit is in a steady state.

2. The thermoelectric watch according to claim 1, wherein a resistor is connected in parallel with the first light emitting diode.

3. The thermoelectric watch according to claim 1, wherein said first light emitting diode has a conduction voltage comprised between 1.5 Volts and 3 Volts.

4. The thermoelectric watch according to claim 1, wherein said first light emitting diode is powered by a battery voltage comprised between 2 Volts and 4 Volts.

5. The thermoelectric watch according to claim 1, wherein said energy management circuit is connected to a second capacitor, said second capacitor being coupled to a second light emitting diode.

6. The thermoelectric watch according to claim 1, wherein said energy management circuit includes a push-pull amplifier stage.

7. The thermoelectric watch according to claim 1, wherein the at least one energy storage element includes two energy storage elements and said energy management circuit is configured to alternately control the charging of the two energy storage elements so as to power a motor or a display of said thermoelectric watch.

* * * * *